United States Patent [19]
Lansford

[11] Patent Number: 6,157,078
[45] Date of Patent: Dec. 5, 2000

[54] REDUCED VARIATION IN INTERCONNECT RESISTANCE USING RUN-TO-RUN CONTROL OF CHEMICAL-MECHANICAL POLISHING DURING SEMICONDUCTOR FABRICATION

[75] Inventor: Jeremy Lansford, Austin, Tex.

[73] Assignee: Advanced Micro Devices, Inc., Sunnyvale, Calif.

[21] Appl. No.: 09/401,914

[22] Filed: Sep. 23, 1999

[51] Int. Cl.$^7$ .................................................. H01L 21/4763
[52] U.S. Cl. ......................... 257/734; 257/773; 257/774; 257/784
[58] Field of Search ............................ 438/618; 257/734, 257/773, 774, 784

[56] References Cited

U.S. PATENT DOCUMENTS

| | | |
|---|---|---|
| 5,877,037 | 3/1999 | O'Keefe et al. |
| 6,038,383 | 3/2000 | Young et al. |
| 6,040,240 | 3/2000 | Matsubara |

*Primary Examiner*—Kevin M. Picardat
*Assistant Examiner*—D. M. Collins
*Attorney, Agent, or Firm*—Kevin L. Daffer; Conley, Rose & Tayon

[57] ABSTRACT

A method, system, and memory storage medium for reducing variation of interconnect resistance of integrated circuits are provided. Interconnects are formed by a damascene process in which trenches are formed in an interlevel dielectric. The dimensions of the trenches are then measured. The dimension measurement results and the resistivity of the interconnect material are used to calculate a target thickness of interconnect material within the trench that gives a predetermined interconnect resistance. Interconnect material is then deposited within the trenches and upon the interlevel dielectric. A chemical-mechanical polishing process, which is used to remove interconnect material external to the trench, is then adjusted to leave the target thickness of interconnect material such that the completed interconnects have the predetermined resistance. Optionally, the resistance of the interconnects on the completed integrated circuits may be measured and compared to the predetermined interconnect resistance. Any observed deviations may then be used to further adjust the chemical-mechanical polishing process for subsequently fabricated integrated circuits.

10 Claims, 5 Drawing Sheets

REDUCED VARIATION IN INTERCONNECT RESISTANCE USING RUN-TO-RUN CONTROL OF CHEMICAL-MECHANICAL POLISHING DURING SEMICONDUCTOR FABRICATION

BACKGROUND OF THE INVENTION

1. Field of the Invention

This invention relates to fabrication methods for integrated circuits and, more particularly, to a method, a system, and a memory storage medium containing instructions and/or data for implementing the method and the system for reducing variation in interconnect resistances of integrated circuits.

2. Description of the Relevant Art

Fabrication of integrated circuits upon semiconductor substrates ("wafers") involves numerous processing steps. For example, the fabrication of a metal-oxide-semiconductor (MOS) integrated circuit includes forming a gate dielectric, typically composed of silicon dioxide, on a semiconductor substrate doped with either n-type or p-type impurities. For each MOS field-effect transistor (MOSFET) being made, a gate conductor is formed over the gate dielectric and a source and drain are formed by introducing dopant impurities into the semiconductor substrate. Conductive interconnect lines are then formed to connect the MOSFETs to each other and to the terminals of the completed integrated circuit. Modem high-density integrated circuits typically include multiple interconnect levels to provide all of the necessary connections. Multiple interconnect levels are stacked on top of each other with intervening dielectric levels providing electrical insulation between interconnect levels. Conductive plugs formed in the dielectric levels provide electrical connections between interconnects of differing levels.

A prevalent trend in integrated circuit fabrication is increasing the speed at which the circuit operates. The operating speed of a circuit refers to the time needed for a circuit output voltage to respond to a change in an input voltage. A major limiting factor of the operating speed or the circuit comes from an interconnect resistance R and a capacitance C between the interconnect and both ground and other interconnects. Such resistances and capacitances create RC time constants which characterize delays associated with the propagation of signals along the interconnect. Increases in operating speed of a circuit may be obtained, for instance, by reduction in resistance of its interconnects; however, there are other design constraints imposed upon the circuit that limit the amount the resistances may be reduced. For example, reducing the resistance of an interconnect increases the power dissipated as heat by the interconnect for a fixed voltage drop across the interconnect. If the amount of heat generated in the interconnect becomes too large, failure of the circuit may result.

A damascene process is a preferred method for forming interconnects in modern integrated circuits. A damascene process begins with forming trenches in an interlevel dielectric where the trenches correspond to the desired pattern of interconnects. The interlevel dielectric separates differing interconnect levels of the integrated circuit from one another and may have conductive plugs formed within to provide electrical connections between levels. Subsequently, an interconnect material typically a metal, is deposited within the trenches and upon the interlevel dielectric, and the interconnect material located outside of the trenches is then removed by chemical-mechanical polishing (CMP) to complete the formation of the interconnects. This is known as a single damascene process. Alternatively, a dual damascene process includes forming vias corresponding to the desired locations of conductive plugs in the interlevel dielectric in addition to forming trenches for interconnects in the interlevel dielectric. Interconnect material is then simultaneously deposited within the vias and trenches and upon the interlevel dielectric. Interconnect material located outside of the trenches is removed by CMP to finish forming the conductive plugs and interconnects. The damascene process is repeated for every interconnect level contained within the integrated circuit.

CMP is used to remove surface material from semiconductor wafers and to planarize Surfaces. A typical CMP tool is illustrated in FIG. 1. The tool shown in FIG. 1 is commonly referred to as a rotary CMP tool. Semiconductor wafer 10 is held in carrier 12 and is placed face down upon a polishing pad 14 that is attached to table 16. Both carrier 12 and table 16 may rotate and their rotational speeds are independently adjustable. A polishing fluid, typically a slurry, is deposited on the surface of polishing pad 14 through conduit 18. A polishing slurry consists of an abrasive-particle-containing fluid that may be chemically reactive with one or more of the materials on the surface of the wafer. The polishing slurry occupies the interface between wafer 10 and polishing pad 14. During the polishing process, carrier 12 and table 16 are rotated at angular frequencies $\omega_c$ and $\omega_t$, respectively, while carrier 12 applies a force F downward on wafer 10, typically referred to as "down force". The polishing slurry may chemically react with the surface material of wafer 10 while the movement of wafer 10 relative to polishing pad 14 causes the abrasive particles contained in the polishing slurry to strip the reacted material from wafer 10. The amount of material removed by CMP is governed by several variables including down force, carrier rotational speed, table rotational speed, polishing time, polishing pad material, and polishing fluid composition, flow rate, and dispense location.

Another common type of CMP tool is the linear CMP tool. For this CMP tool, the rotating carrier pushes the wafer against a polishing pad that moves linearly underneath the wafer. For the linear CMP tool, the polishing pad is affixed to the surface of a belt whose motion is similar to that of a belt sander. The portion of the belt and pad directly underneath the wafer is supported by a fluid-bearing platen in which a flow of a fluid, such as air, is directed at the belt to counteract the down force exerted by the carrier. The polishing parameters for the linear CMP tool include down force, carrier rotational speed, belt speed, fluid-bearing platen pressure and flow rate, polishing time, polishing pad material, and polishing fluid composition, flow rate, and dispense location.

An interconnect resistance is determined by several factors including the dimensions of the interconnect and the conductive plug and the resistivity of the interconnect material. Each processing step used to fabricate interconnects will introduce variation in the interconnect resistance. For example, the trenches formed in the interlevel dielectrics of integrated circuits from different wafers or the trenches formed in different interconnect levels of the same integrated circuit will have small variations in their dimensions. The interconnect resistance R is given by $R=\rho l/A$ where $\rho$ is the resistivity of the interconnect material, l is the length of the interconnect, and A is the cross-sectional area of the interconnect. Variation in width or depth of the formed trenches will directly correspond to variation in the cross-sectional area of the interconnects which will give rise to variation in interconnect resistance. Interconnect resistance effects properties of the completed integrated circuit, such as operating speed. It is important, therefore, to control variation in interconnect resistance.

Variation in interconnect resistance can cause problems that may lead to failure of the integrated circuit. For instance, if the resistance is too small, excessive heat may be generated within the interconnect, as discussed above. Additionally, variation in resistance changes the time required for signals to propagate along the interconnect and may lead to timing problems both internal and external to the integrated circuit. Timing problems result when one or more signals arrive at a circuit element either earlier or later than expected.

The yield, which is the percentage of completed integrated circuits that are functional, tends to decrease with increasing operating speed. The operating speed targeted for the completed integrated circuit is determined by balancing the conflicting demands of increasing the yield and increasing the speed. Higher yield decreases costs associated with the fabrication process while integrated circuits of higher operating speed will generally be in greater demand by consumers. Variation in interconnect resistance might cause variation in operating speed; however, more applicable, variation in interconnect resistance may cause operating speed reliability issues. Completed integrated circuits may exhibit a distribution of operating speeds centered about an average operating speed. The average operating speed targeted is generally chosen such that the operating speed at the high end of the distribution will give a predetermined yield.

Modern fabrication methods minimize variation in interconnect resistance by minimizing the variation caused by each processing step. For example, trenches in the interlevel dielectric are typically formed by dry anisotropic etching of the interlevel dielectric. For different wafers and for different interconnect levels on the same wafer, the etched trenches will have some variation in their depth due to variation in a variety of etching parameters, including etching time. If variation in etching parameters, such as etching time, are minimized, variation in trench depth, which directly effects variation in interconnect resistance, will be minimized.

If the variation in interconnect resistance, for both interconnects of different wafers and of different interconnect levels on the same wafer, could be further reduced, the potential for excessive heating and timing problems would also be reduced. Additionally, a reduced variation in interconnect resistance will also narrow the distribution of operating speeds. The average operating speed targeted could then be increased since the narrower distribution of operating speeds would allow a higher average operating speed while still maintaining a given yield at the high end of the distribution. It is therefore desirable to develop an improved method for reducing the variation in interconnect resistance for interconnects of different wafers and for interconnects of different interconnect levels on the same wafer.

SUMMARY OF THE INVENTION

The problems outlined above are in large part addressed by measuring the dimensions of a trench and/or a via, calculating a thickness of interconnect material within the trench such that a predetermined resistance results, and then adjusting the CMP process so as to leave that thickness of interconnect material within the trench. This method is used to supplement the method described above of minimizing variation introduced by each processing step.

Adjusting the CMP process, as opposed to merely minimizing its variation, reduces variation in interconnect resistance since the uncertainty associated with measuring the dimensions of the trench and via is less than the variation associated with the processing steps prior to CMP of the interconnect material, such as variation in trench and/or via dimensions. The uncertainty in measuring the dimensions may be more than one hundred times less than the variation associated with the processing steps. Any variation in interconnect resistance resulting from the method described herein comes from the uncertainty in measuring the dimensions of the interconnect and the variations associated with CMP of the interconnect material. By reducing variation in interconnect resistance, excessive heating and timing problems associated with the completed integrated circuits may be alleviated and the average operating speed of the completed integrated circuits may be increased without adversely affecting the yield of the fabrication process.

Either a single or dual damascene process may be used to form an interconnect. For a dual damascene process, trenches and vias corresponding to the desired locations of conductive plugs and interconnects are formed in an interlevel dielectric. The dimensions of the vias and trenches are then measured, preferably using a scanning electron microscope and an ellipsometer. Using the dimensions of the trenches and vias and the resistivity of the interconnect material, a target thickness of the interconnect material within the trench that results in a predetermined interconnect resistance may be calculated. The predetermined interconnect resistance is based upon design specifications for integrated circuit being fabricated. Interconnect material is then deposited within the vias and trenches and upon the interlevel dielectric to a known depth. The CMP process is then adjusted so that the amount of interconnect material removed leaves a final thickness of interconnect material that is approximately equal to the target thickness of interconnect material, which was previously calculated, within the trench upon completion of the CMP process. The CMP process may be adjusted by modifying one or more of its parameters including changing the down force, the table rotational speed or belt speed, the carrier rotational speed, the polishing time, the polishing pad material, the fluid-bearing platen pressure and flow rate, and the polishing fluid composition, flow rate, and dispense location. For a single damascene process, the principal difference would be that conductive plugs would be formed in the interlevel dielectric before forming, trenches for the interconnects.

Multiple integrated circuits typically are fabricated on the same wafer and multiple wafers are processed together in groups called lots. A typical lot contains 25 wafers. The dimensions of the trenches and vias need not be measured for every wafer in the lot since variation between wafers of the same lot is usually observed to be minimal. Typically, dimension measurements are performed only on 2 to 5 wafers from each lot and the average of the measurements is used to calculate the target thickness of interconnect material within the trenches for all wafers of that lot. Preferably, dimension measurements are made while forming each interconnect level of the integrated circuit.

The interconnect material deposition depth upon the interlevel dielectric is preferably determined using a monitor wafer. A functional circuit is not constructed upon a monitor wafer. The monitor wafer is processed only by one or more tools to isolate the performance of those tools. Interconnect material is deposited on a monitor wafer by the same tool used to deposit interconnect material on product wafers, which are wafers upon which functional integrated circuits are constructed. The depth of interconnect material deposited on the monitor wafer is then determined by one of several means including measuring the resistance of the material and inferring the depth, cleaving the monitor wafer in two and measuring the depth with a scanning electron microscope, and removing the interconnect material from a portion of the monitor wafer and measuring the depth using a profilometer. Monitor wafers are typically run after every 25 to 200 product wafers since the depth to which interconnect material is deposited by a particular tool is generally observed to vary slowly over the time period required to process those product wafers.

An additional embodiment of the method further employs a feedback step to measure the resistance of the completed interconnects and uses that information to further modify the CMP process. After an integrated circuit is completed, the resistance of representative interconnects may be directly measured using a test station and any deviation from the predetermined resistance is noted. The integrated circuit is complete at this point and its interconnect resistances cannot be modified; however, the information regarding the interconnect resistances can be used to correct for systematic errors and long-term drifts such that the interconnect resistance of subsequently fabricated integrated circuits will be closer in value to the predetermined resistance. For example, if the measured interconnect resistances show a consistent deviation from the predetermined value, the CMP process may be further modified to correct for this deviation. Similar modifications could be periodically performed if the measured interconnect resistances reveal a consistent drift in value.

A system, which includes a computer system connected to a CMP tool, a scanning electron microscope, and an ellipsometer, can be used to implement the method described above. A database on the computer system maintains a record of the dimensions of the trenches and vias measured on wafers by the scanning electron microscope and the ellipsometer, a record of interconnect material deposition depth upon monitor wafers, and a record of the resistivities of the materials used to form the interconnects and conductive plugs. When a wafer is ready to be processed by the CMP tool, the computer system then uses the appropriate dimensions and resistivities recorded in the database to calculate a target thickness of interconnect material such that a predetermined resistance, which is also recorded in the database, is achieved. The computer system then uses the target thickness and interconnect material deposition depth to calculate an amount of the interconnect material to be removed. One or more parameters of the CMP process is then modified such that the calculated amount of material will be removed. The CMP tool then removes the excess interconnect material.

Additionally, the computer system may also be connected to a test station that measures the interconnect resistances of completed integrated circuits. The measurements of the completed interconnect resistances are recorded in the database and the computer system compares those measurements to the corresponding predetermined interconnect resistances. The computer system then uses the comparisons to further adjust the CMP process parameters to correct for any observed systematic errors and long-term drifts.

A computer-readable memory storage medium is also contemplated herein. The storage medium contains program instructions that can be implemented by an execution unit to adjust a CMP tool's process parameters. The storage medium also includes trench and via dimension measurement data, monitor wafer interconnect material deposition depth data, desired resistance data, and CMP process parameter data. The instructions cause the execution unit to use the data to calculate an amount of material needed to be removed by the CMP tool in order to leave a thickness of the interconnect material such that the predetermined resistance is achieved. The execution unit then modifies the CMP process parameter data so that the CMP tool will remove the interconnect material such that the calculated thickness is left. Additionally, the storage medium may also include completed interconnect resistance measurement data. The execution unit may then use the completed interconnect resistance measurement data to further modify the CMP process parameter data to correct for any observed systematic errors and long-term drift.

BRIEF DESCRIPTION OF THE DRAWINGS

Other objects and advantages of the invention will become apparent upon reading the following detailed description and upon reference to the accompanying drawings in which.

Figure 1:
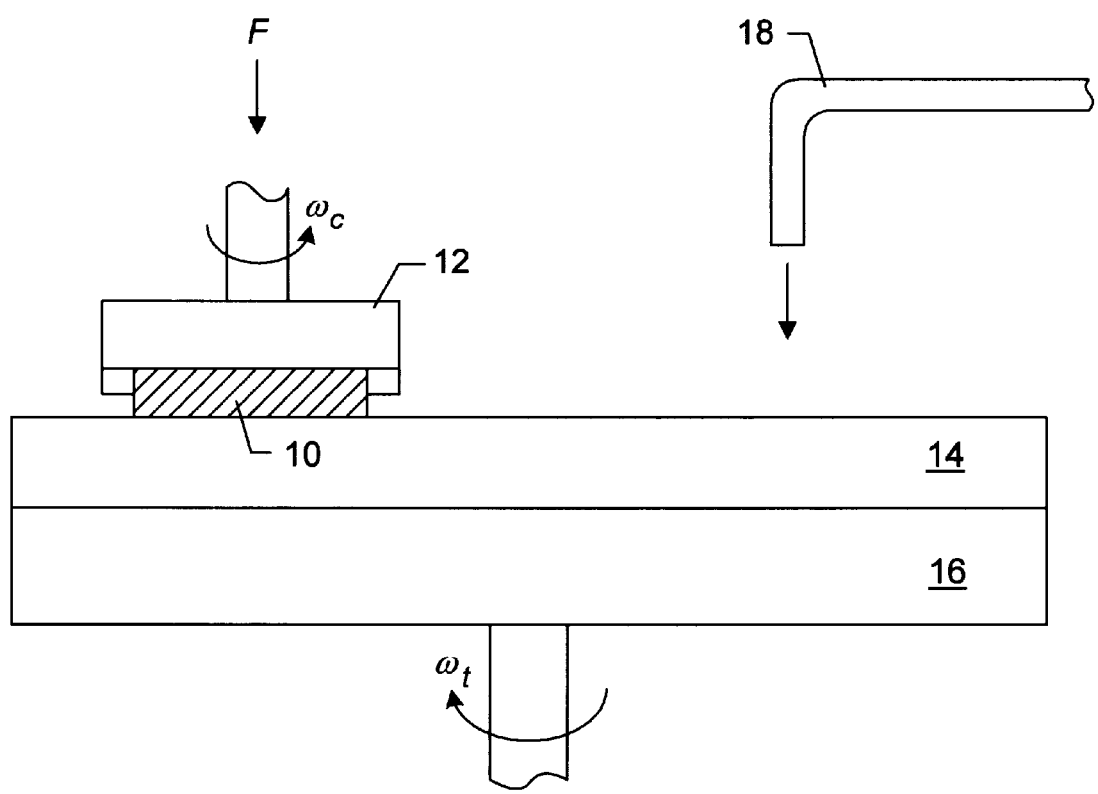
FIG. 1 is a side-view schematic of an apparatus for CMP of the surface of a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Figure 2:
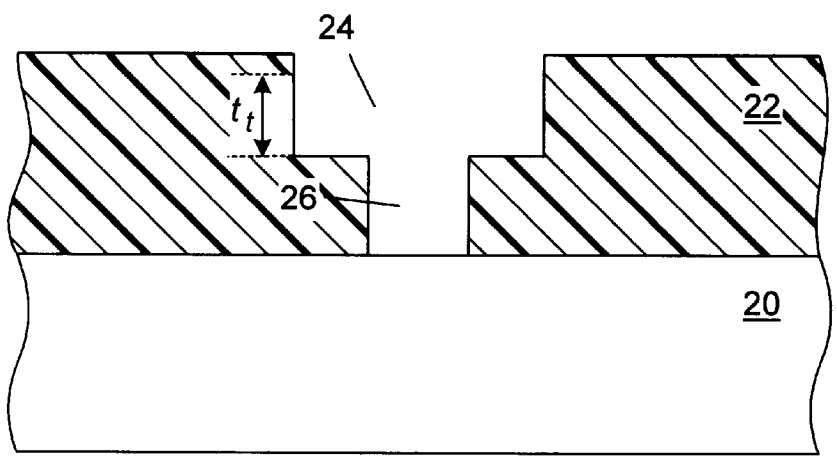
FIG. 2 is a partial cross-sectional view of a semiconductor topography including a semiconductor substrate and an interlevel dielectric with a trench and a via formed within the interlevel dielectric.
Figure 3:
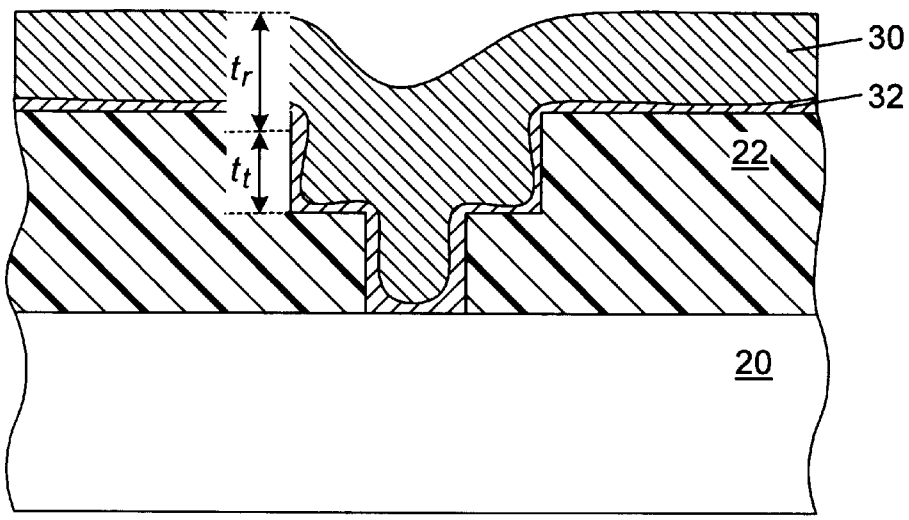
FIG. 3 is a partial cross-sectional view of the semiconductor topography in which an interconnect material has been deposited within the trench and the via and upon the interlevel dielectric, subsequent to the trench and via formation of FIG. 2.
Figure 4:
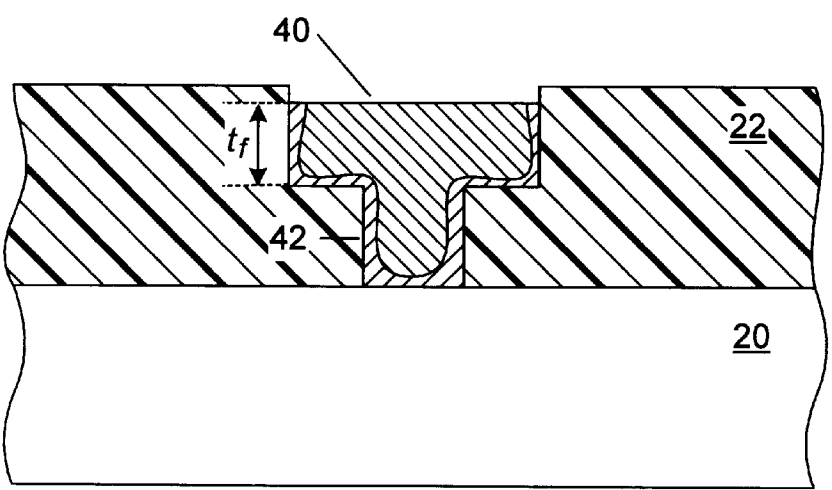
FIG. 4 is a partial cross-sectional view of the semiconductor topography in which portions of the interlevel dielectric external to the trench are removed, subsequent to the interconnect material deposition of FIG. 3.

FIGS. 2–4 illustrate a method for forming interconnects of an integrated circuit that includes some embodiments of the method recited herein. In FIG. 2, semiconductor substrate 20 contains a plurality of transistors and may also contain one or more interconnect layers. Interlevel dielectric 22 is formed upon the upper surface of substrate 20. Interlevel dielectric 22 is shown as a single layer, however, it may be a stack of dielectric layers such as a line dielectric, an etch stop, and a via dielectric. Suitable materials for interlevel dielectric 22 include silicon dioxide, silicon oxynitride, doped oxides, organic low-permittivity dielectrics, or any dielectric with a dielectric constant less than that of silicon dioxide (which has a dielectric constant of approximately 3.8 to 4.0). Interlevel dielectric 22 may be formed by various methods including chemical vapor deposition or spin-on techniques. Subsequently, interlevel dielectric 22 is patterned and etched to form vias and trenches. Via 26 extends down from trench 24 through interlevel dielectric 22 to the upper surface of substrate 20. Trench 24 and via 26 are typically formed using a photolithographic process and an anisotropic dry etching process. Trench 24 defines the geometry of the interconnect while via 26 defines the geometry of the conductive plug that are subsequently formed.

Once the trenches and vias are formed, their dimensions may be measured. The measurement is preferably accomplished using a scanning electron microscope and an ellipsometer. A scanning electron microscope uses a focused electron beam to create a magnified image of a surface. The electron beam is rastered over the surface and secondary electrons emitted from the surface are used to modify the intensity of an image as a function of the electron beam location. This image may be captured by a computer which can analyze the image and determine the width and length dimensions of the trenches and the vias. An ellipsometer measures the thickness of dielectrics using the change of state of the polarization of light reflected from the interface between the dielectric and underlying substrate. The polarization change depends on several parameters including the thickness of the dielectric. Ellipsometers typically operate under computer control that can automatically determine a dielectrics thickness. The dimensions, both width and thickness, are generally measured at several representative sites across the wafer surface to obtain the average dimensions of the vias and trenches. Typically, between 5 and 15 sites on the wafer are examined.

The target thickness of interconnect material within trench 24 that gives a predetermined interconnect resistance can be calculated once the dimensions of the trenches and vias are known. Target thickness $t_t$ shown in FIG. 2 is an example of a calculated thickness that will give a specific resistance for an interconnect formed in trench 24. Calculation of thickness $t_t$ includes finding a resistance of an interconnect formed in trench 24 and adding it in series to a resistance of a conductive plug formed in via 26. The resistance of a conductive plug formed in via 26 is given by its cross-sectional area, its height, and the resistivity of the material used to form the plug. If additional layers, such as adhesion or barrier layers, will be present, their resistances are included in the calculation. Additionally, if via 26 is formed with sloped sidewalls instead of sidewalls perpendicular to the upper surface of substrate 20, this geometrical factor is also included in the calculation. The resistance of an interconnect formed in trench 24 is given by its cross-sectional area, its length, and the resistivity of the material used to form the interconnect. If additional layers, such as adhesion or barrier layers, will be present, their resistances are also included in the calculation. Thickness $t_t$ of an interconnect formed in trench 24 is used in finding the cross-sectional area of the interconnect which is in turn used in finding the resistance of the interconnect. A value for thickness $t_t$ is then solved for by setting the resistance of the interconnect to be formed in trench 24 equal to the predetermined interconnect resistance.

FIG. 3 shows the deposition of interconnect material 30 onto interlevel dielectric 22 and into trench 24 and via 26. Suitable interconnect materials include aluminum, copper, or any alloys containing) aluminum and/or copper. To prevent diffusion of copper into interlevel dielectric 22, barrier layer 32 may be deposited first. Barrier layer 32 may comprise, for example, tantalum, tantalum nitride, titanium, or titanium nitride. Interconnect material 30 may be deposited by sputtering, chemical vapor deposition, and/or electroplating. FIG. 3 illustrates a portion of a dual damascene process in which interconnect metal is simultaneously deposited within trench 24 and via 26. A single damascene process would form a conductive plug within a via followed by the formation of a trench within the interlevel dielectric and the deposition of an interconnect material. For the single damascene process, the material deposited within the via could be the same or different from the material deposited within the trench. For instance, the conductive plug could include tungsten, aluminum, copper, or any alloys of tungsten, aluminum, and/or copper possibly with a thin adhesion layer comprising, for example, titanium nitride while the interconnect could include aluminum, copper, or any alloys of aluminum and/or copper possibly with a thin barrier layer.

The amount of interconnect material 30 to be removed is determined using the previously calculated thickness $t_t$ and an interconnect material deposition depth. Removal thickness $t_r$ to be removed by chemical-mechanical polishing is shown in FIG. 3. The depths of all deposited materials are preferably determined using monitor wafers. Each type of material is deposited upon a monitor wafer using the same tool which deposits the material on the product wafers. The material deposition depth on the monitor wafers may be determined by various ways Such as measuring the resistance and inferring the depth, cleaving the wafer in two and measuring the depth with a scanning electron microscope, or removing the material from a portion of the wafer and measuring the depth with a profilometer. Monitor wafers are typically run after every 25 to 200 product wafers to compensate for long-term drifts in the material deposition depth by the tool.

FIG. 4 shows the removal of portions of interconnect material 30 and barrier layer 32 external to trench 26 by CMP to form interconnect 40 and conductive plug 42. The CMP process used to remove interconnect material 30 external to trench 24 is adjusted such that the removal thickness $t_r$ of interconnect material 30 is removed. The CMP process may be adjusted by modifying the down force, the table rotational speed or belt speed, the carrier rotational speed, the polishing time, the polishing pad material, the fluid-bearing platen pressure and flow rate, or the polishing fluid composition, flow rate, and dispense location. As shown in FIG. 4, final thickness if of interconnect material 30 remains in trench 24 after CMP. The final thickness $t_f$ is preferably approximately equal to the calculated target thickness $t_t$. Formation of interconnect 40 generally involves over-polishing of the interconnect material 30 within trench 24 in which the CMP process leaves the upper surface of interconnect 40 below the upper surface of interlevel dielectric 22. Over-polishing can be accomplished by increasing the polishing time beyond that necessary to completely remove interconnect material 30 and barrier layer 32 from the surface of interlevel dielectric 22 when using a polishing fluid that is more reactive with interconnect material 30 and barrier layer 32 than with interlevel dielectric 22.

Figure 5:
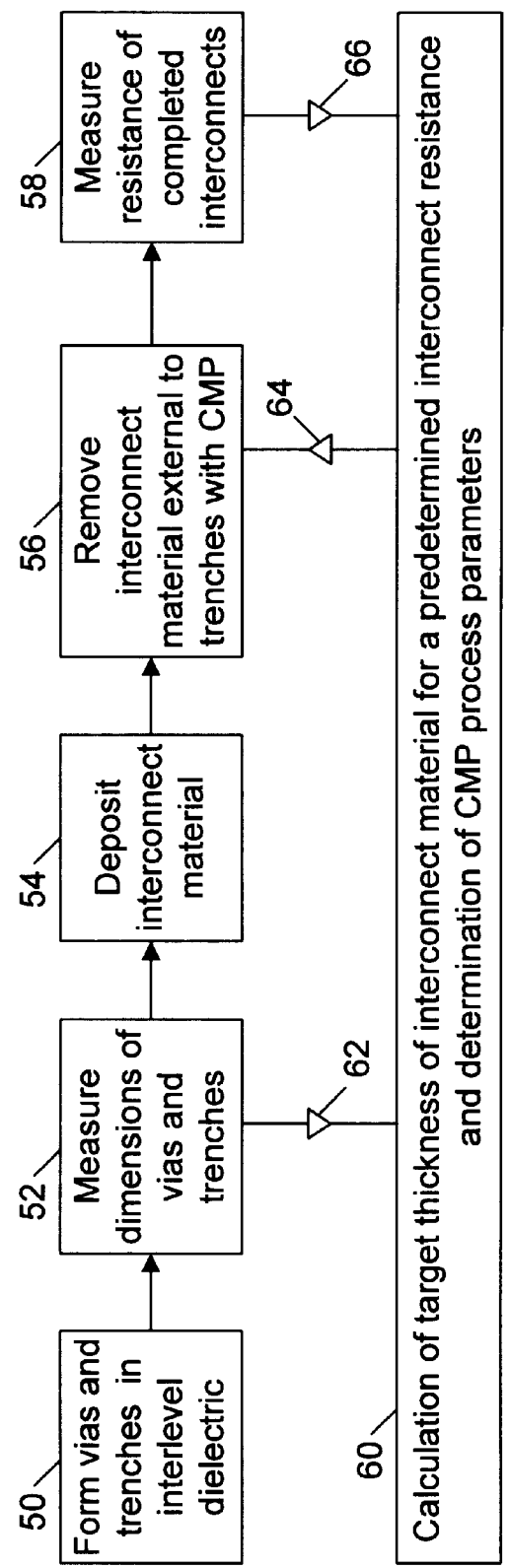
FIG. 5 is an exemplary block diagram showing the flow of process steps and its relationship to the calculation of interconnect material thickness for some embodiments of the method described herein.

FIG. 5 is a block diagram showing the flow of process steps and its relationship to the calculation of interconnect material thickness for some embodiments of the method recited herein. Initially, trenches and vias are formed (box 50) in an interlevel dielectric previously formed on the topography of a wafer. Typically, wafers are processed together in lots of 25 wafers. The dimensions of the trenches and vias are measured (box 52) typically at 5 to 15 sites per wafer on 2 to 5 wafers in the lot. The width and length dimension measurements are preferably made using a scanning electron microscope while the thickness measurements are preferably made using an ellipsometer. This dimension measurement information is then supplied (arrow 62) to the calculation of target interconnect thickness for a predetermined interconnect resistance (box 60). For all wafers in a given lot, the dimensions used for the calculation comprise the average of dimension measurements performed on wafers within the lot. Interconnect material is then deposited (box 54) within the trenches and vias and upon the interlevel dielectric. The target interconnect thickness and amount of interconnect material to be removed is then calculated and the CMP process parameters are modified (box 60) and the modified CMP process parameters are supplied (arrow 64) to the CMP tool. The interconnect material external to the trenches is then removed by the CMP (box 56) for each wafer in the lot.

As an additional embodiment, the resistances of representative completed interconnects of one or more wafers in the lot may be measured (box 58) by a test station. This is typically done after the integrated circuit is complete. The measured resistances may be supplied (arrow 66) to the calculation of target thickness (box 60) and if the measured resistances differ from the predetermined resistance by more than a set amount, the CMP process parameters can be further modified so that the completed interconnect resistances of wafers in subsequently processed lots will be closer to the predetermined resistances. There are many possible causes for the measured resistances to differ from the predetermined resistance. For example, CMP of the interconnect material using a specific set of process parameters may remove more or less material than expected. In that case, the final thickness $t_f$, shown in FIG. 4, will not be equal to the calculated target thickness $t_t$, shown in FIG. 2, and therefore the interconnect resistance will not be as expected. Adjustment of the CMP process parameters will result in final thickness $t_f$ of interconnects formed for subsequently fabricated integrated circuits being closer in value to calculated target thickness $t_t$.

Figure 6:
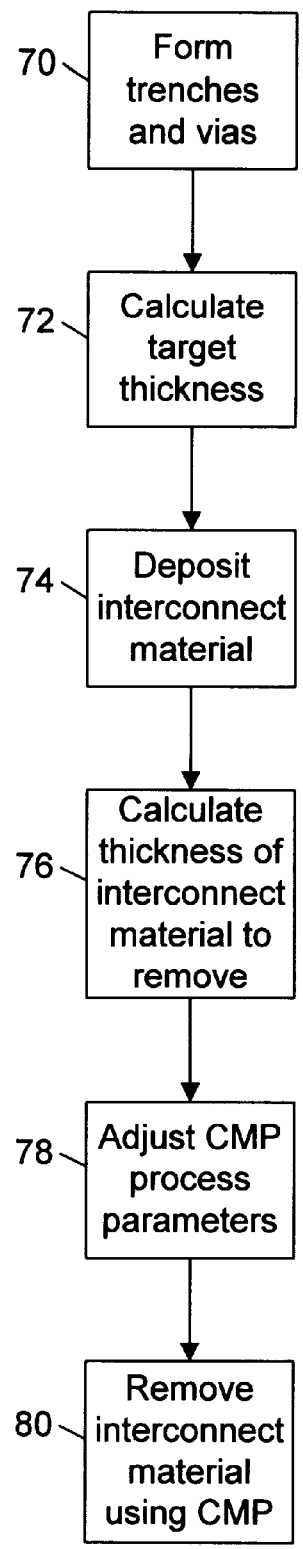
FIG. 6 is a flow diagram for an exemplary procedure of interconnect formation according to some embodiments of the method depicted in FIG. 5.

FIG. 6 illustrates a flow diagram for an exemplary procedure of interconnect formation according to some embodiments of the method depicted in FIG. 5. Trenches and vias are formed in an interlevel dielectric of a semiconductor substrate (box 70). A target thickness of interconnect material within a trench that results in a predetermined interconnect resistance is calculated (box 72). The calculation typically uses the average of trench and via dimension measurements performed on one or more wafers within the lot. Interconnect material is deposited within the trenches and vias and upon the interlevel dielectric (box 74). The thickness of interconnect material to be removed is then calculated (box 76) using the calculated target thickness and the interconnect material deposition depth, which is preferably determined by measuring the depth interconnect material is deposited on a monitor wafer. The CMP process parameters are adjusted (box 78) so that the calculated thickness will be removed. Portions of the interconnect material external to the trenches are removed using CMP (box 80) such that a final thickness of interconnect material within the trench is approximately equal to the calculated target thickness.

Figure 7:
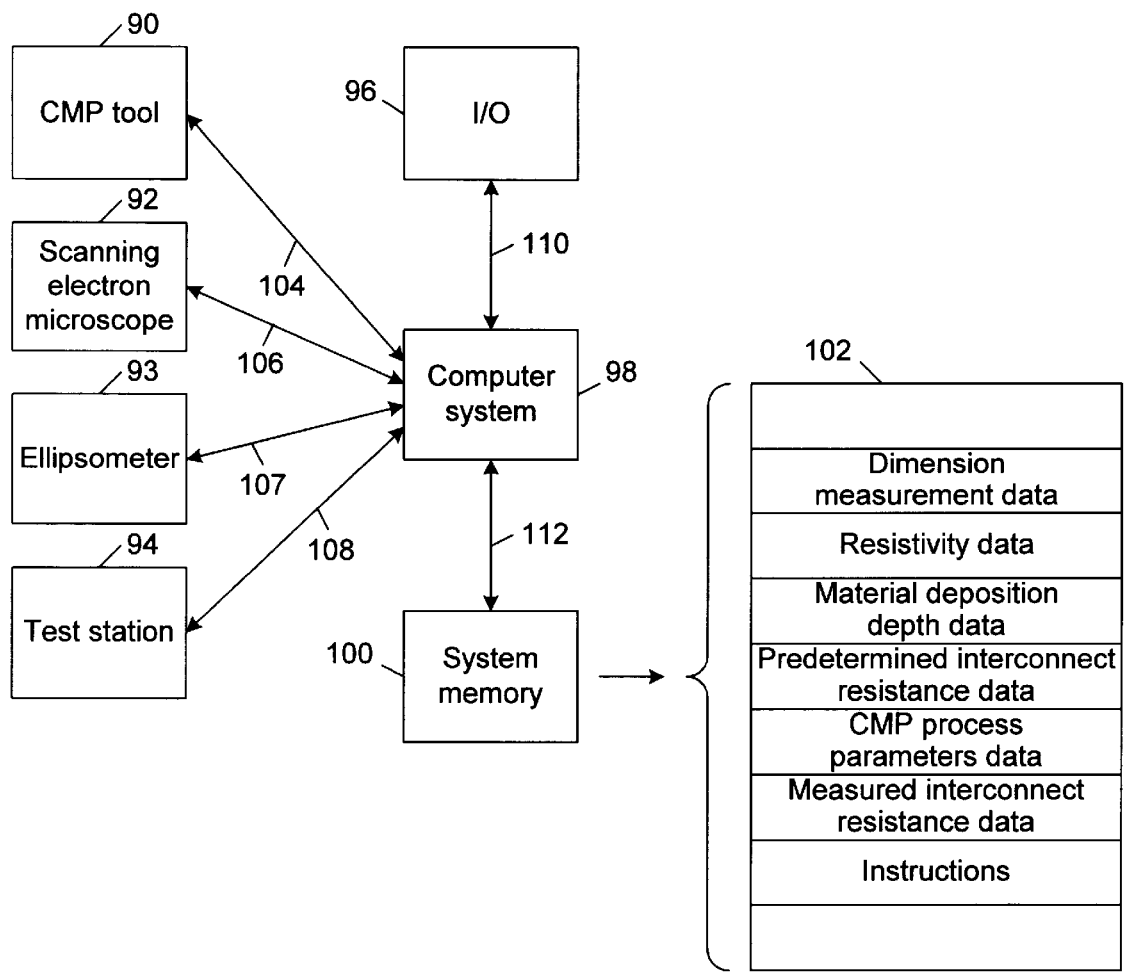
FIG. 7 is an exemplary block diagram of the interconnection of a CMP tool, a scanning electron microscope, an ellipsometer, a test station, and a computer system for implementation of some embodiments of the method described herein.

FIG. 7 depicts a block diagram of the interconnection of a CMP tool, a scanning electron microscope, an ellipsometer, a test station, and a computer system for implementing some embodiments of the method described above. CMP tool 90, scanning electron microscope 92, ellipsometer 93, and test station 94 are connected to computer system 98 by two-way buses 104, 106, 107, and 108, respectively. Additionally, computer system 98 is connected to I/O unit 96 by bus 110 and to system memory 100 by local bus 112. I/O unit 96 can include a keyboard and a monitor for users to input data including resistivity and material deposition depth. System memory 100 is either a volatile or non-volatile storage medium which can include a hard disk, a floppy disk, a read-only memory, and/or a random-access memory in which data and instructions are stored. A portion of the information stored in system memory 100 is shown in memory address space 102. The information in memory address space 102 includes instructions and a database that contains dimension measurement data, resistivity data, material deposition depth data, predetermined interconnect resistance data, CMP process parameter data, and measured interconnect resistance data.

An execution unit in computer system 98 can receive predetermined interconnect resistance data from I/O unit 96 and dimension measurement data from scanning electron microscope 92 and ellipsometer 93 and store them in memory address space 102. The execution unit can then execute the instructions located in memory address space 102 to fetch the dimension measurement data, resistivity data, and predetermined interconnect resistance data and use it to calculate a target interconnect thickness that gives the predetermined interconnect resistance. The instructions are then used by the execution unit to modify the CMP process parameter data based on the target thickness and material deposition depth data so that CMP tool 90 will leave approximately the target thickness of interconnect material alter polishing of the wafer.

The execution unit may also receive measured resistances of the completed interconnects from test station 94. If the measured interconnect resistance deviates by more than a set amount from the predetermined interconnect resistance, the CMP process parameter data can be modified by the execution unit in computer system 98 such that future wafers polished by CMP tool 90 will have interconnect resistances closer to the predetermined resistance.

It will be appreciated to those skilled in the art having the benefit of this disclosure that this invention is believed to provide a method for reducing the variation in interconnect resistance of integrated circuits. Further modifications and alternative embodiments of various aspects of the invention will be apparent to those skilled in the art in view of this description. For example, the method recited herein could be done completely manually by recording measurements on paper, calculating a desired thickness of an interconnect material by hand, and manually adjusting a CMP process. It is intended that the following claims are interpreted to embrace all such modifications and changes and, accordingly, the specification and drawings are to be regarded in an illustrative rather than a restrictive sense.

What is claimed is:

1. A system for controlling a formation of an interconnect of an integrated circuit, comprising:
   a computer system operably linked to several processing and measurement tools;
   a scanning electron microscope linked to the computer system for sending width and length dimension measurement results of trenches;
   an ellipsometer linked to the computer system for sending depth dimension measurement results of trenches;

a chemical-mechanical polishing tool linked to the computer system for receiving chemical-mechanical polishing process parameters;

a database, stored within the computer system, adapted for maintaining records comprising the dimension measurement results of the trenches, a resistivity of an interconnect material, an interconnect material deposition depth, the chemical-mechanical polishing process parameters, and a predetermined interconnect resistance; and a program, adapted for execution on the computer system, to modify the chemical-mechanical polishing process parameters based upon a calculation of a target thickness of the interconnect material that results in the predetermined resistance.

2. The system of claim 1, wherein the chemical-mechanical polishing tool removes the interconnect material such that a final thickness of the interconnect material is left within the trenches.

3. The system of claim 2, wherein the final thickness is approximately equal to the target thickness.

4. The system of claim 1, wherein the chemical-mechanical polishing process parameters include a down force, a carrier rotational speed, a table rotational speed or a belt speed, a polishing time, a polishing pad material, a fluid-bearing platen pressure and flow rate, and a polishing fluid composition, flow rate, and dispense location.

5. The system of claim 1, wherein the calculation of the target thickness that results in the predetermined resistance is based upon the dimension measurements of the trenches and the resistivity of the interconnect material.

6. The system of claim 1, further comprising a test station linked to the computer system for sending measurement results of completed interconnect resistances, wherein:

the database is further adapted for maintaining records of the completed interconnect resistance measurement results;

the program is further adapted for comparing the measured interconnect resistances to the predetermined interconnect resistance; and the program is also adapted for further modifying the chemical-mechanical process parameters based upon said comparing such that a measured interconnect resistance of a subsequently fabricated integrated circuit interconnect is closer in value to the predetermined interconnect resistance.

7. A computer-readable storage medium having program instructions operable for controlling formation of an interconnect of an integrated circuit, said storage medium comprising:

dimension measurement data which corresponds to the dimensions of trenches formed in an interlevel dielectric;

resistivity data which corresponds to the resistivity of an interconnect material deposited within the trenches and upon the interlevel dielectric;

interconnect material deposition depth data which corresponds to the depth to which the interconnect material is deposited upon the interlevel dielectric;

predetermined interconnect resistance data which indicates a target resistance for completed interconnects;

chemical-mechanical polishing process parameter data; and an instruction based on the dimension measurement data, the resistivity data, and the interconnect material deposition depth data, wherein the instruction is executably adapted to calculate a target interconnect material thickness that gives the target resistance and modify the chemical-mechanical process parameter data Such that chemical-mechanical polishing of the interconnect material will give a final interconnect material thickness that is approximately equal to the target interconnect material thickness.

8. The storage medium of claim 7, wherein the storage medium comprises a hard disk, a floppy disk, a read-only memory, and/or a random-access memory.

9. The storage medium of claim 7, wherein the dimension measurement data is produced by a scanning electron microscope and an ellipsometer.

10. The storage medium of claim 7, further comprising:

measured interconnect resistance data which corresponds to a measured resistance of the completed interconnect;

evaluation data which corresponds to a comparison of the measured interconnect resistance data and the predetermined interconnect resistance data; and an additional instruction based on the evaluation data, wherein the additional instruction is executably adapted to further modify the chemical-mechanical process parameter data such that a measured resistance of a subsequently fabricated integrated circuit interconnect is closer in value to the target resistance.

* * * * *